(12) United States Patent
Ishii

(10) Patent No.: US 12,429,497 B2
(45) Date of Patent: Sep. 30, 2025

(54) MANUFACTURING METHOD OF SEMICONDUCTOR DEVICE AND TEST SOCKET FOR USE IN THE SAME

(71) Applicant: RENESAS ELECTRONICS CORPORATION, Tokyo (JP)

(72) Inventor: Toshitsugu Ishii, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 389 days.

(21) Appl. No.: 18/068,089

(22) Filed: Dec. 19, 2022

(65) Prior Publication Data

US 2024/0201223 A1 Jun. 20, 2024

(51) Int. Cl.
| | |
|---|---|
| *G01R 1/04* | (2006.01) |
| *H01L 23/00* | (2006.01) |
| *H01L 23/31* | (2006.01) |
| *H01L 23/495* | (2006.01) |

(52) U.S. Cl.
CPC ........ *G01R 1/0441* (2013.01); *H01L 23/3107* (2013.01); *H01L 23/49555* (2013.01); *H01L 24/32* (2013.01); *H01L 24/48* (2013.01); *H01L 24/73* (2013.01); *H01L 2224/32245* (2013.01); *H01L 2224/48153* (2013.01); *H01L 2224/73265* (2013.01)

(58) Field of Classification Search
CPC ...... H01L 2924/14; H01L 25/50; H01L 22/00
See application file for complete search history.

(56) References Cited

U.S. PATENT DOCUMENTS

| | | | |
|---|---|---|---|
| 2009/0302876 A1* | 12/2009 | Koizumi ............ | G01R 31/2863 324/756.07 |
| 2012/0108108 A1* | 5/2012 | Horikawa ............ | H01R 12/716 439/626 |
| 2013/0102093 A1* | 4/2013 | Ogawa ................... | H01L 24/97 438/15 |
| 2016/0141215 A1* | 5/2016 | Ishii ..................... | G01R 1/0466 438/15 |
| 2017/0025318 A1* | 1/2017 | Ishii ........................ | H01L 24/49 |
| 2023/0266362 A1* | 8/2023 | Ishii ..................... | G01R 1/0466 324/500 |

FOREIGN PATENT DOCUMENTS

| | | |
|---|---|---|
| JP | 10-270140 A | 10/1998 |
| JP | 2022-045105 A | 3/2022 |

* cited by examiner

*Primary Examiner* — Huy Q Phan
*Assistant Examiner* — Temilade S Rhodes-Vivour
(74) *Attorney, Agent, or Firm* — Rimon P.C.

(57) ABSTRACT

A manufacturing method of a semiconductor device includes a step of preparing a test object including a body for sealing a semiconductor chip and a lead terminal, a step of preparing a test socket including a first contact pin, and a step of electrically testing the semiconductor chip by contacting the first contact pin with the lead terminal. The lead terminal includes a lead upper surface located on an upper surface side of the body and a lead bottom surface located on an bottom surface side of the body. The lead terminal includes a protruding portion protruding from the body, and a connecting portion. The lead terminal further includes a bending portion that connects the protruding portion and the connecting portion. Then, in the electrical test step, the first contact pin is contacted with the lead bottom surface of the protruding portion.

15 Claims, 23 Drawing Sheets

Z : IMPEDANCE
RC1,RC2,RC1',RC2' : CONTACT RESISTANCE AND LINE RESISTANCE

MANUFACTURING METHOD OF SEMICONDUCTOR DEVICE AND TEST SOCKET FOR USE IN THE SAME

BACKGROUND

This application disclosure relates to a manufacturing method of a semiconductor device and a test socket for use in the manufacturing method of the semiconductor device, and more particularly, to the test socket for use in the manufacturing method of the semiconductor device with a galowing-shaped lead terminal.

The manufacturing method of the semiconductor device includes a wide variety of testing steps. The testing steps are roughly classified into following two. One is a wafer test that is performed on a semiconductor wafer on which a large number of semiconductor chips are formed, and the other is a package test that is performed on the semiconductor device in which individual semiconductor chips are sealed in resin.

In the package test, individual semiconductor device (test object) is mounted on the test socket to perform an electrical test of the semiconductor chip. The semiconductor device includes a lead terminal electrically connected to the semiconductor chip. The test socket is provided with a contact pin, and in the package test, the lead terminal is pressed against the contact pin. The following description relates to the package test, and "test" refers to "package test".

For example, Japanese Patent Laid-Open No. JP-A-10-270140 (Patent Document 1) discloses a test in which a lead (corresponding to the above-mentioned "lead terminal") of a package (corresponding to the above-mentioned "semiconductor device") is contacted with a contact pin.

In addition, Japanese Patent Laid-Open No. JP-2022-45105 (Patent Document 2) discloses a Kelvin test. An electrode terminal (corresponding to the above-mentioned "lead terminal") of an IC device (corresponding to the above-mentioned "semiconductor device") is contacted with a first contact and a second contact (corresponding to the above-mentioned "contact pin").

SUMMARY

Mounting of a semiconductor device on a mounting substrate is performed by connecting a lead terminal of the semiconductor device to the mounting substrate using a solder material. And, in order to improve a wettability of the solder material, the lead terminals of the semiconductor device are covered with a plated layer. This improves the reliability of connecting the lead terminal to the mounting substrate. However, the inventor of this application study revealed the problem of the semiconductor device mounting failure.

As disclosed in the Patent Document 1, when the lead terminal of the semiconductor device is electrically connected, a connecting portion of the lead terminal (a region connected to the mounting substrate by the solder material) is pressed against the contact pin, and therefore, unevennesses are generated on a surface of the plated layer of the connecting portion. Since the wettability of the solder material at a location where the unevenness occurrence is reduced, the reliability of connecting between the lead terminal and the mounting substrate is reduced.

On the other hand, as a performance of the semiconductor chip increases, test under a high-temperature environment and test to apply a high current become essential. And in the test for applying the high current, the Kelvin test disclosed in the Patent Document 1 is essential. Due to these factors, the unevenness (surface roughness) of the plated layer at the connecting portion of the lead terminal becomes conspicuous. Therefore, there is a demand for a technique for improving the reliability of connecting between the lead terminal and the mounting substrate. Other purpose and novel features will become apparent from the description of this specification and the accompanying drawings.

The typical ones of the embodiments disclosed in this present application will be briefly described as follows.

A manufacturing method of a semiconductor device according to an embodiment includes a step of preparing a test object including a body for sealing a semiconductor chip and a lead terminal, and a step of preparing a test socket including a first contact pin. The manufacturing method of the semiconductor device further comprises contacting the lead terminal with the first contact pin to electrically test the semiconductor chip. The body includes an upper surface, a bottom surface, and a side surface connecting the upper surface and bottom surface. The lead terminal is electrically connected to the semiconductor chip and includes a lead upper surface located on the upper surface side of the body and a lead bottom surface located on bottom surface side of the body. The lead terminal includes a protruding portion protruding from the body and located on the relatively upper surface side in the thickness direction of the body, and the connecting portion located on the relatively bottom surface side and connected to the mounting substrate by a solder material. The lead terminal further includes a bending portion that connects the protruding portion and the connecting portion and extends in a direction intersecting the upper surface. Then, in an electrical test step, the first contact pin is brought into contact with the lead bottom surface of the protrusion.

The test socket according to the embodiment includes a base to which the first contact pin is attached, and a floating guide that is separate from the base and includes a mounting portion on which the test object is placed. The test object includes the body and the lead terminal that encapsulate the semiconductor chip and include an upper surface, bottom surface, and a side surface connecting the upper surface and bottom surface. The lead terminal is electrically connected to the semiconductor chip and includes the lead upper surface located on the upper surface side of the body and the lead bottom surface located on bottom surface side of the body. Further, the lead terminal protrudes from the body, and includes a protruding portion located on the relatively upper surface side in the thickness direction of the body, and a connecting portion located on the relatively bottom surface side and connected to the mounting substrate by the solder material. The lead terminal further includes the bending portion that connects the protruding portion and the connecting portion and extends in the direction intersecting the upper surface. Then, the first contact pin is contacted with the lead bottom surface of the protruding portion, and an electrical test of the test object is performed.

DETAILED DESCRIPTION

Figure 1:
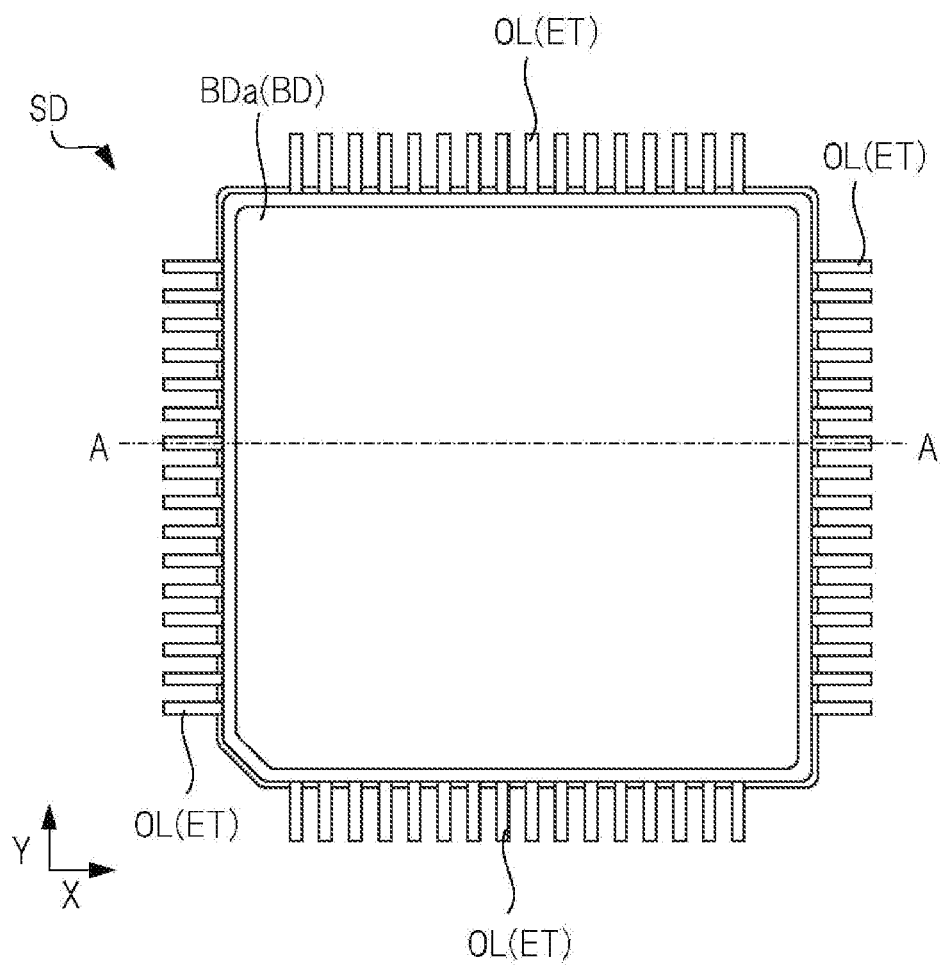
FIG. 1 is a plan view of a semiconductor device in a first embodiment.

In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

Figure 2:
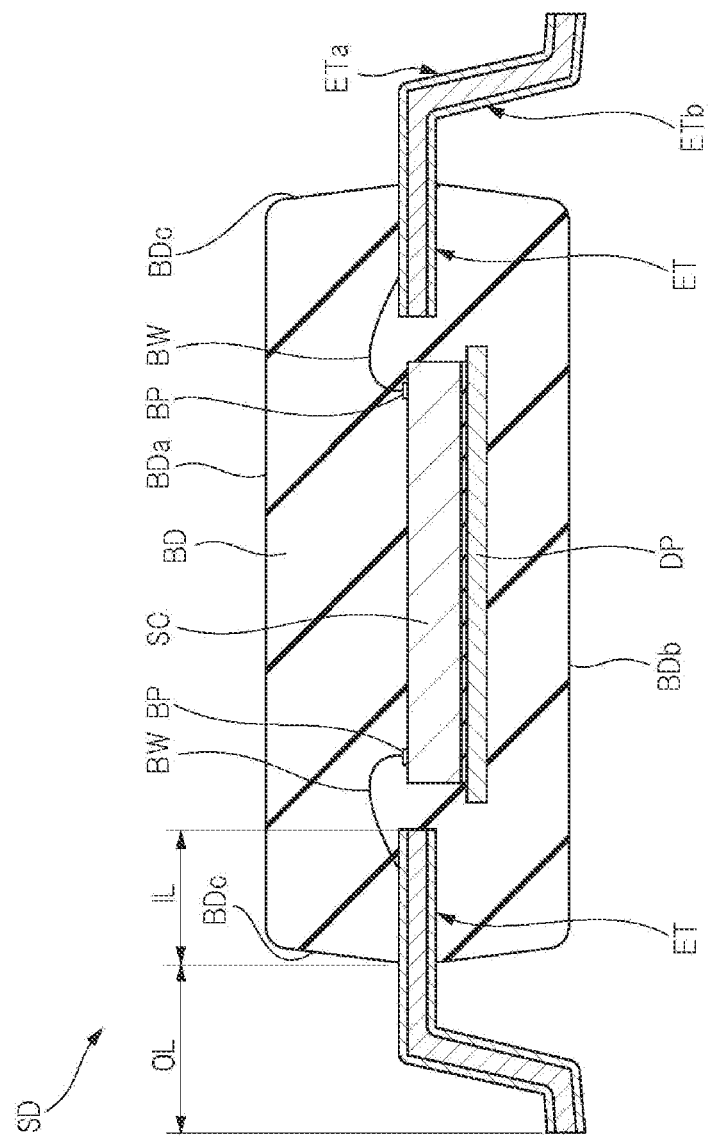
FIG. 2 is a cross-sectional view along A-A line of the semiconductor device shown in FIG. 1.
Figure 3:
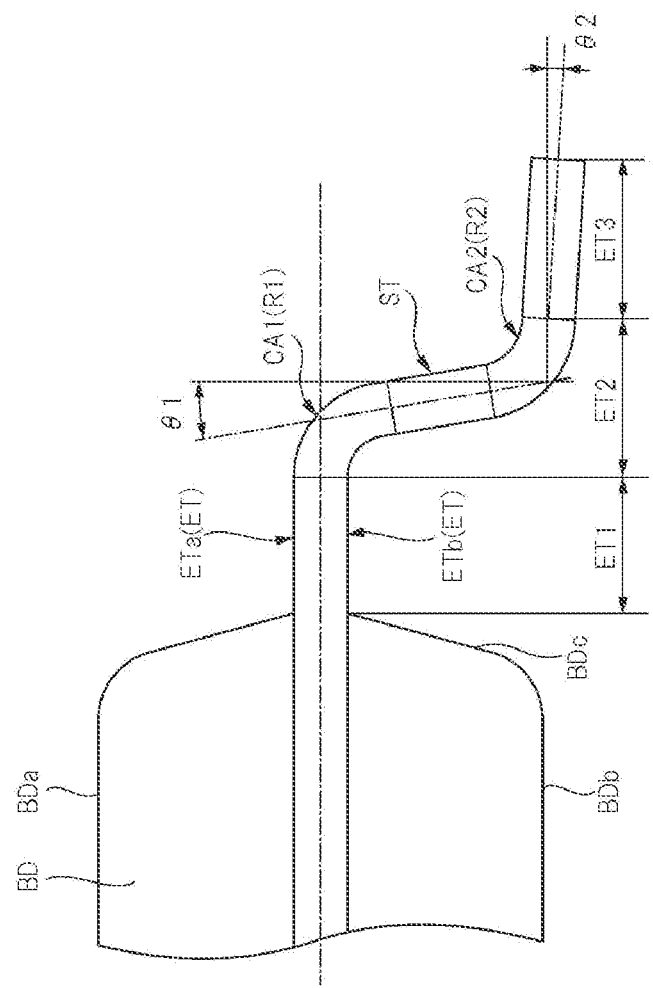
FIG. 3 is an enlarged main portion view of the semiconductor device shown in FIG. 2.

Note that the plated layer shown in FIG. 2 is omitted in FIG. 3 and thereafter. Further, as described with reference to FIG. 2, the lead terminal includes an internal lead portion and an external lead portion, but in FIG. 3 and subsequent figures, the external lead portion is referred to as the lead terminal.

First Embodiment

<Structure of Semiconductor Device>

A semiconductor device in a first embodiment is QFP (Quad Flat Package) or SOP (Small Outline Package) with a galwing-shaped lead terminal. Hereinafter, QFP will be used for explanation.

FIG. 1 is a plan view of the semiconductor device SD in the first embodiment. FIG. 2 is a cross-sectional view along A-A line of the semiconductor device shown in FIG. 1. FIG. 3 is an enlarged main portion view of the semiconductor device shown in FIG. 2.

As shown in FIG. 1, the semiconductor device SD includes a body BD and a plurality of lead terminals ET. in plan view, the plurality of lead terminals ET is disposed on each of four sides of the rectangular body BD, and the plurality of lead terminals ET of respective sides extend in a direction perpendicular to the respective sides. As shown in FIG. 1, a cutout portion called an index portion is provided at one corner portion of the rectangular body BD. Abbreviated rectangles with rounded or chamfered corners are also referred to as rectangles.

As shown in FIG. 2, a semiconductor chip SC, a die pad DP, a wire BW, and a lead terminal ET are disposed in the body BD. The semiconductor chip SC is bonded onto the die pad DP. The semiconductor chip SC is electrically connected to the lead terminal ET. Specifically, the semiconductor chip SC includes a plurality of bonding pads BP, and the plurality of bonding pads BP are connected to the plurality of lead terminals ET via the wires BW.

The body BD is configured of, for example, an epoxy-resin, and seals the semiconductor chip SC, the die-pad DP, the wire BW, and a portion of the lead terminal ET. The body BD includes a body upper surface BDa, a body bottom surface BDb, and a body side surface BDc. The body upper surface BDa and the body bottom surface BDb are surfaces perpendicular to the thickness direction of the body BD and parallel to a mounting substrate on which the semiconductor device SD is mounted. In the thickness direction of the body BD, the body upper surface BDa is a surface that is relatively away from the mounting substrate, and the body bottom surface BDb is a surface that is relatively close to the mounting substrate. The body side surface BDc is a surface connecting the body upper surface BDa and the body bottom surface BDb, and the lead terminal ET protrudes from the body side surface BDc to an outside.

The lead terminal ET includes a lead upper surface ETa and a lead bottom surface ETb. The lead upper surface ETa is relatively located on the body upper surface BDa side, and the lead bottom surface ETb is relatively located on the body bottom surface BDb side. In other words, in the thickness direction of the body BD, the lead upper surface ETa is a surface that is relatively away from the mounting substrate, and the lead bottom surface ETb is a surface that is relatively close to the mounting substrate. The lead terminal ET is made of copper-based material or iron-based material, and the lead upper surface ETa and the lead bottom surface ETb are covered with a plated layer. The plated layer is composed of, for example, tin (Sn). tin (Sn) containing bismuth (Bi), or tin (Sn) containing copper (Cu). The lead terminal ET includes an internal lead portion IL covered within the body BD and an outer lead portion OL protruding outside the body BD. The plated layer cover at least the outer lead portion OL. The plated layer improves a wettability of a solder material when the semiconductor device SD is connected to the mounting substrate using the solder material.

As illustrated in FIG. 3, the lead terminal ET includes a protruding portion ET1, a bending portion ET2, and a connecting portion ET3. The protruding portion ET1, the bending portion ET2, and the connecting portion ET3 constitute the outer lead portion OL protruding from the body BD (see FIG. 2). The protruding portion ET1 is relatively located on the body upper surface BDa side in the thickness direction of the body BD, and the connecting portion ET3 is relatively located on the body bottom surface BDb side in the thickness direction of the body BD.

The bending portion ET2 connects the protruding portion ET1 and the connecting portion ET3, and extends in a direction intersecting the body upper surface BDa or the body bottom surface BDb of the body BD. The bending portion ET2 includes a first arcuate portion CA1, a straight portion ST, and a second arcuate portion CA2. The straight portion ST is inclined with respect to the thickness direction of the body BD (in other words, the direction perpendicular to the body upper surface BDa of the body BD), and has an angle θ1. The first arcuate portion CAL is provided between the protruding portion ET1 and the straight portion ST, in other words, the first arcuate portion CA1 is located at a boundary with the protruding portion ET1. And the first arcuate portion CA1 has an arcuate shape in a first radius R1. Further, the second arcuate portion CA2 is provided between the connecting portion ET3 and the straight portion ST. And the second arcuate portion CA2 has an arcuate shape in a second radius R2.

The connecting portion ET3 is an area connected to the mounting substrate (not shown) via the solder material, and the connecting portion ET3 is inclined with respect to the body upper surface BDa or the body bottom surface BDb of the body BD, and has an angle θ2. When the semiconductor device SD is connected to the mounting substrate via the solder material as shown in FIG. 2, the solder material is interposed between the connecting portion ET3 and the mounting substrate. And a part of the solder material creeps up to the bending portion ET2.

<Manufacturing Method of Semiconductor Device>

Figure 4:
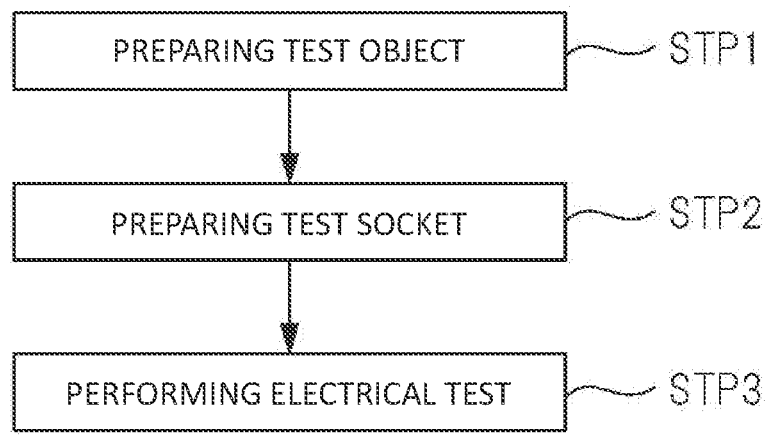
FIG. 4 is a process flow diagram illustrating a manufacturing method of a semiconductor device in the first embodiment.
Figure 5:
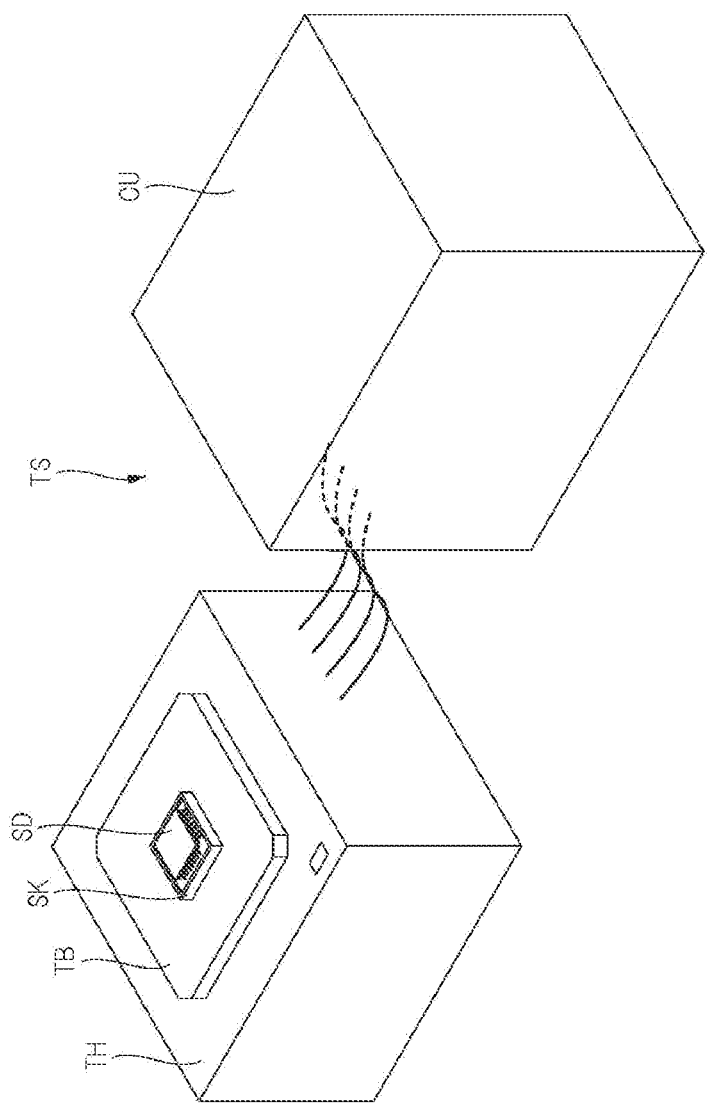
FIG. 5 is a schematic diagram of a test device in the first embodiment.
Figure 6:
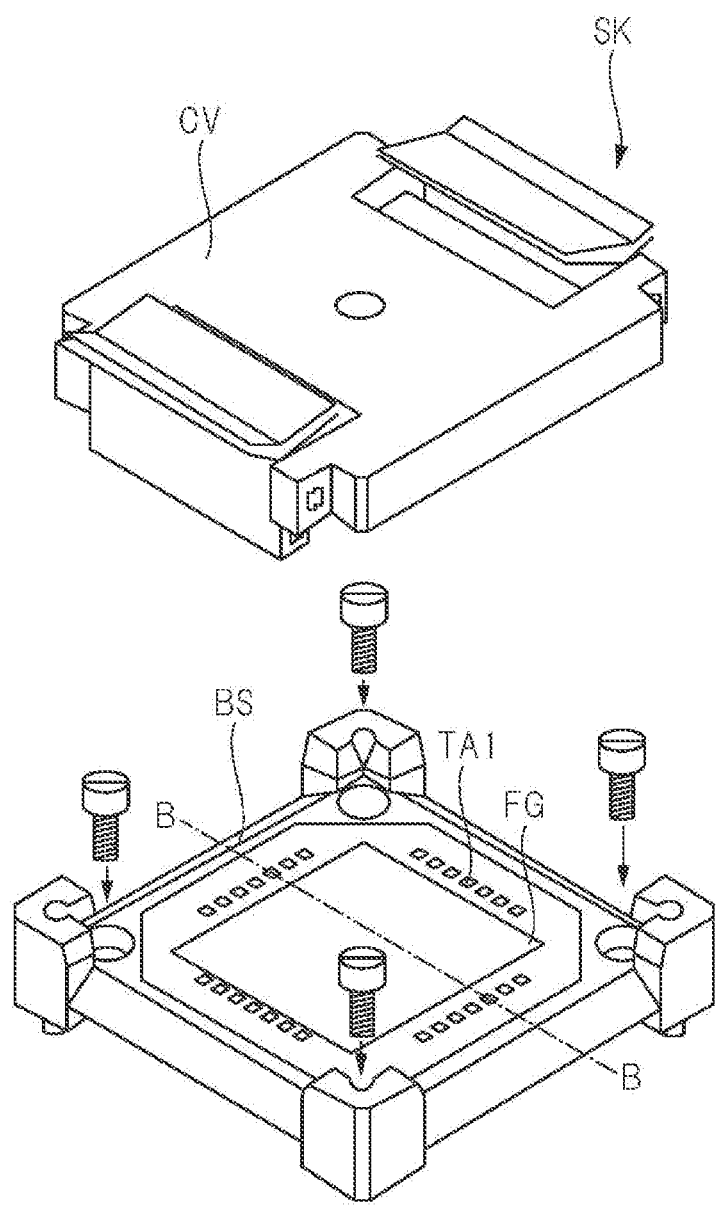
FIG. 6 is a perspective view of a test socket used for an electrical test in the first embodiment.
Figure 7:
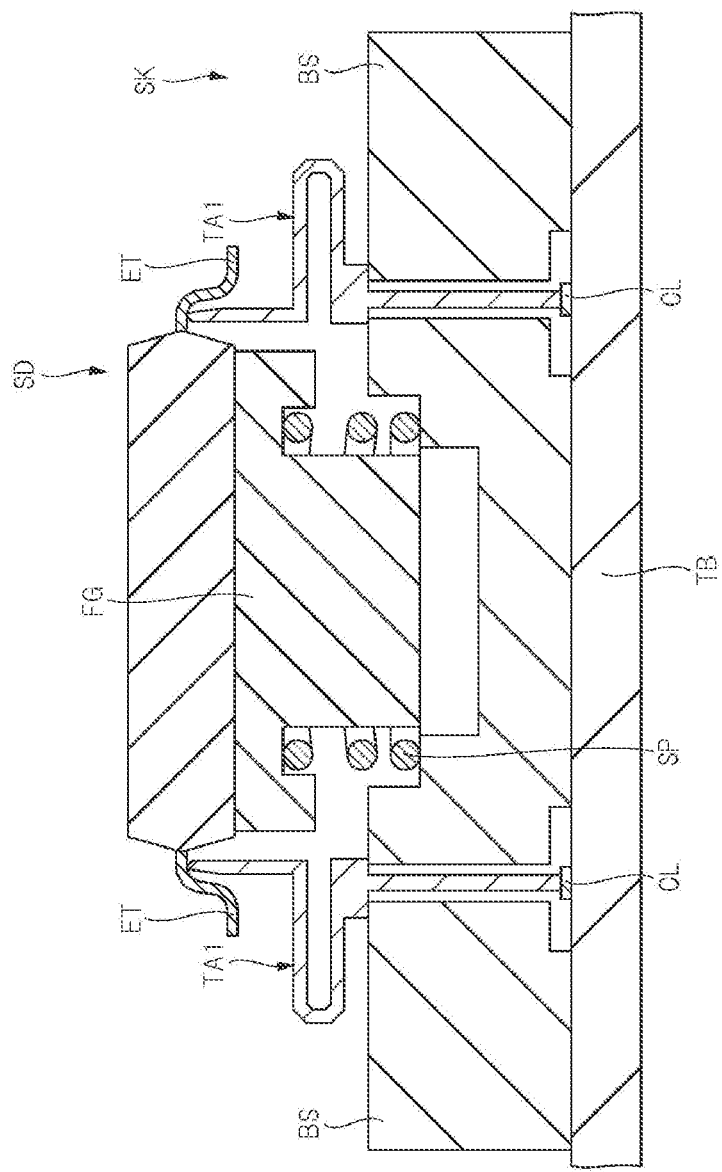
FIG. 7 is a cross-sectional view showing an electrical test step of the semiconductor device in the first embodiment.
Figure 8:
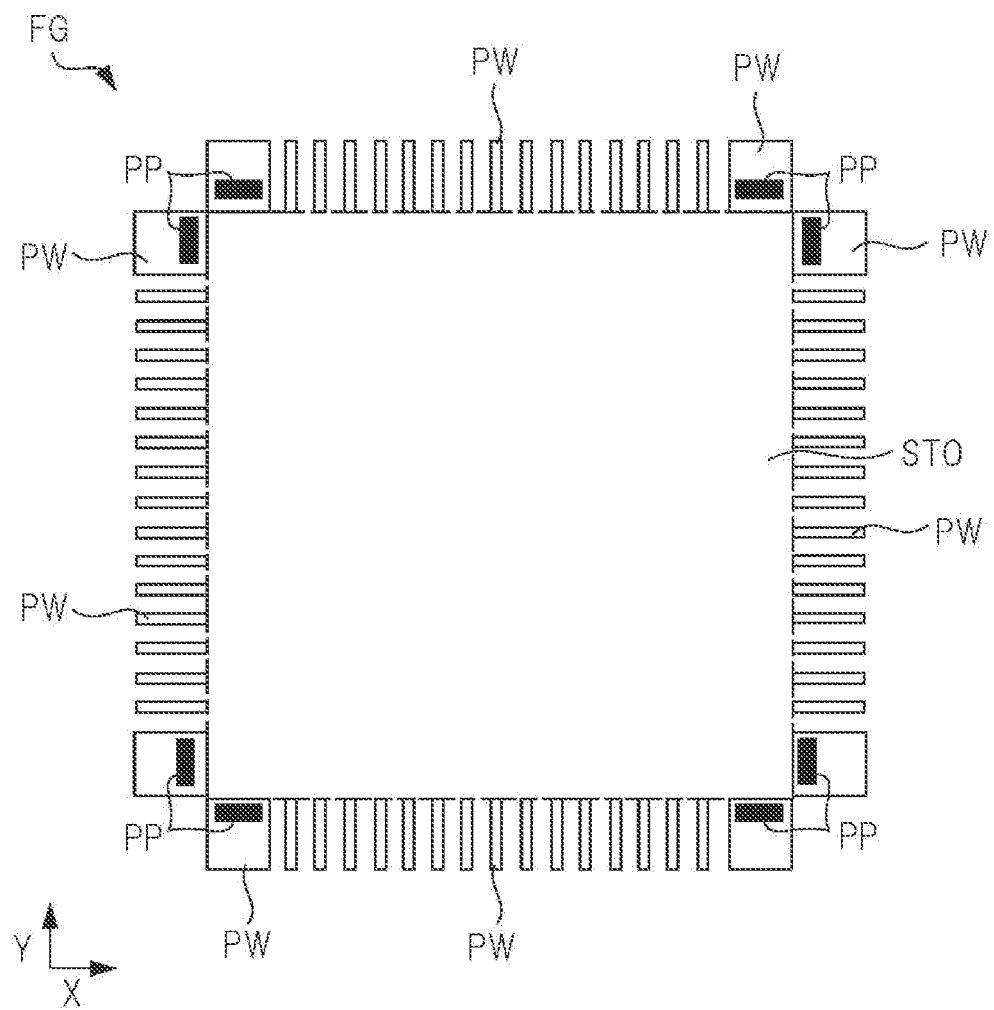
FIG. 8 is a main portion plan view of the test socket in the first embodiment.
Figure 9A:
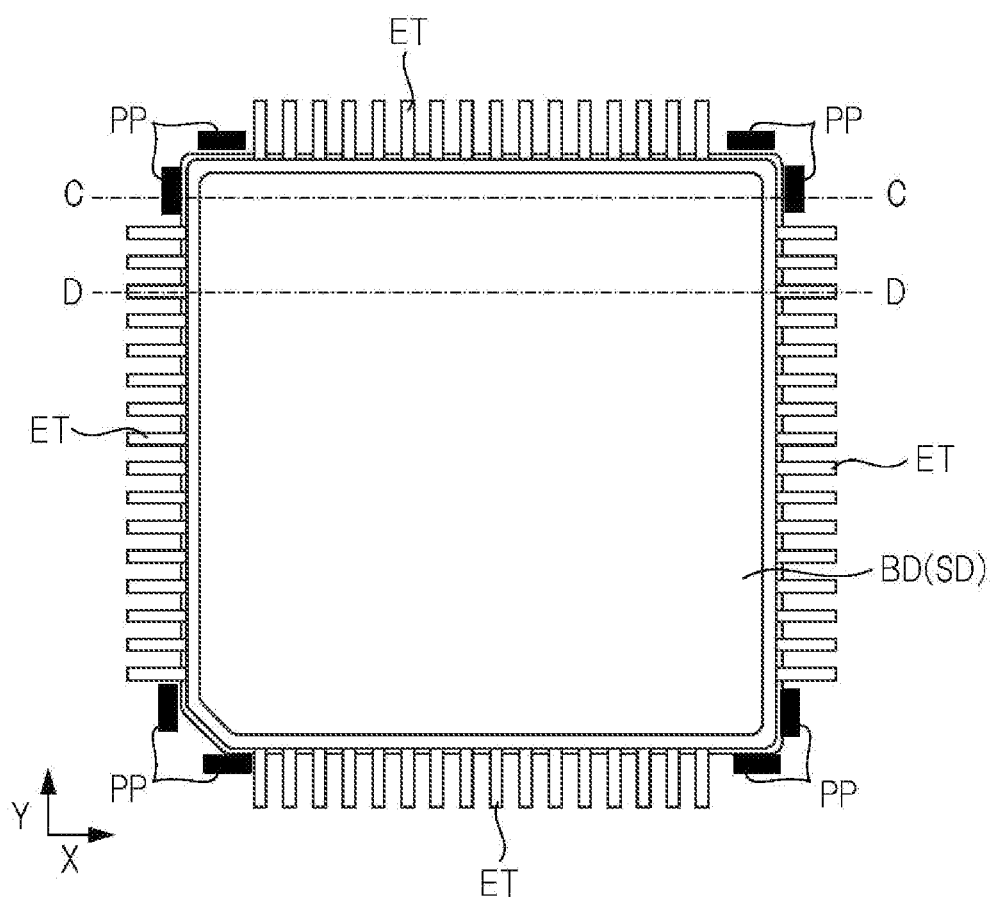
FIG. 9A is a main portion plan view of the test socket in the first embodiment.
Figure 9B:
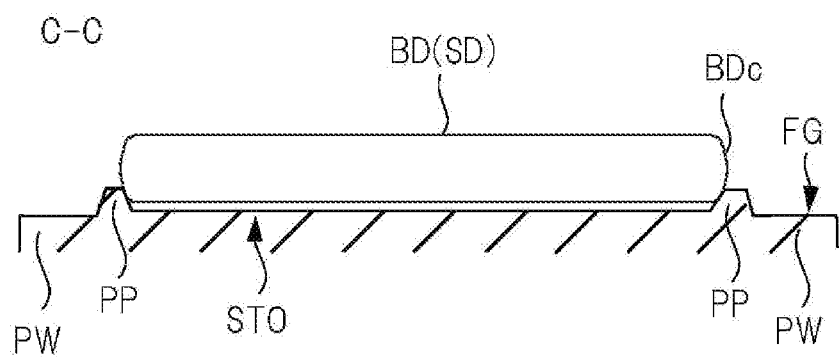
FIG. 9B is a cross-sectional view along C-C of the test socket shown in the FIG. 9A.
Figure 9C:
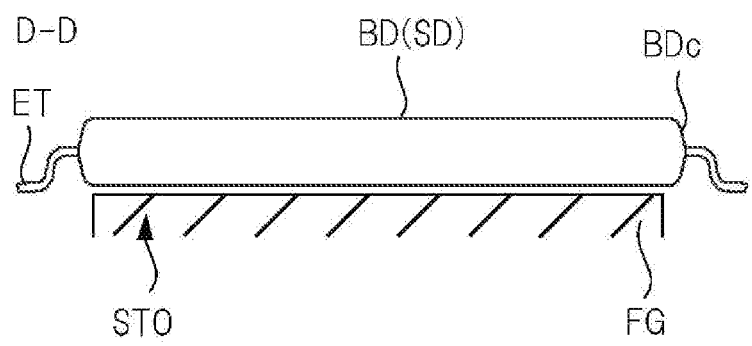
FIG. 9C is a cross-sectional view along D-D of the test socket shown in the FIG. 9A.
Figure 10:
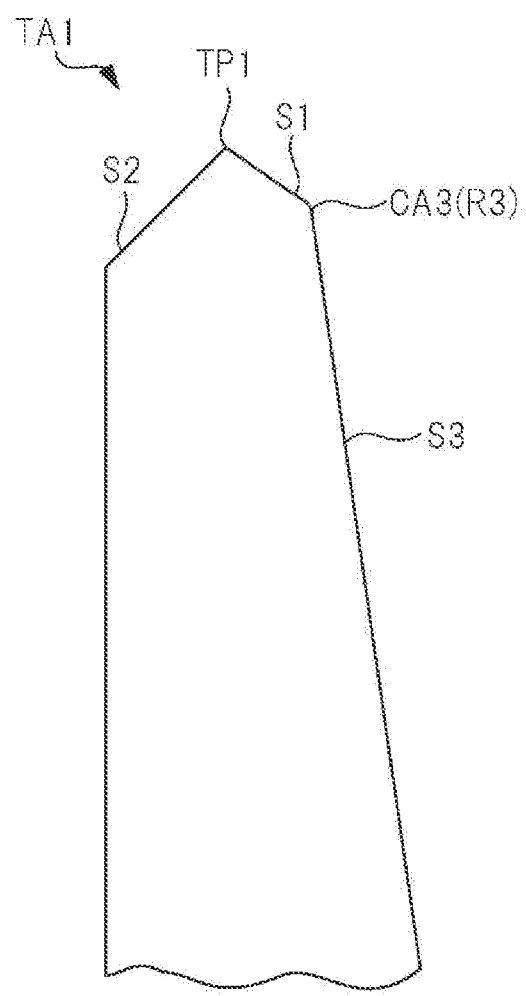
FIG. 10 is an enlarged main portion view of a contact pin in the first embodiment.
Figure 11A:
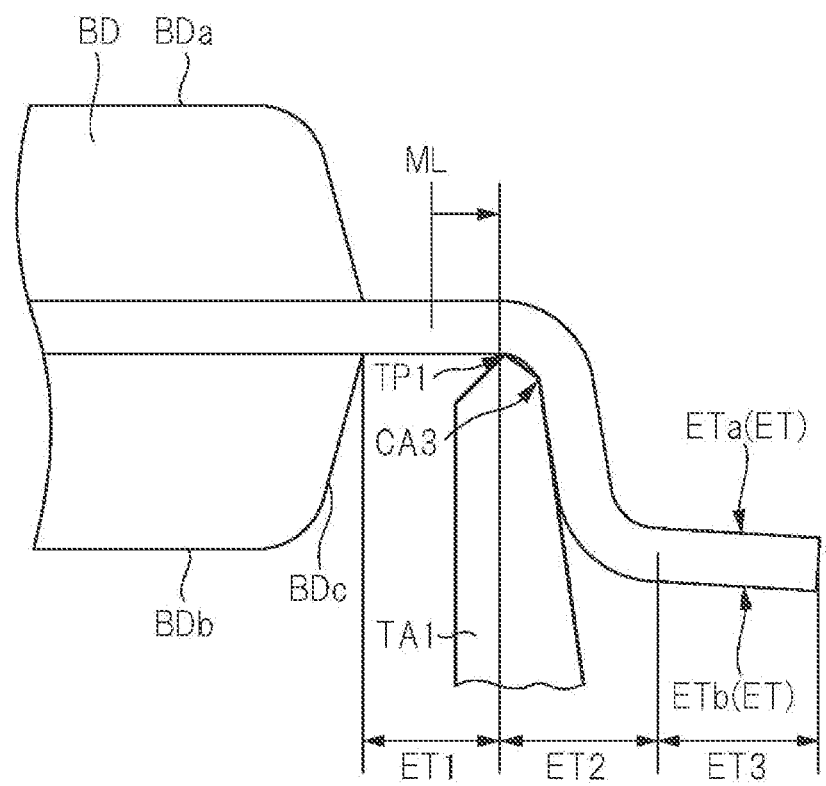
FIG. 11A is a cross-sectional view showing the electrical test step in the first embodiment.
Figure 11B:
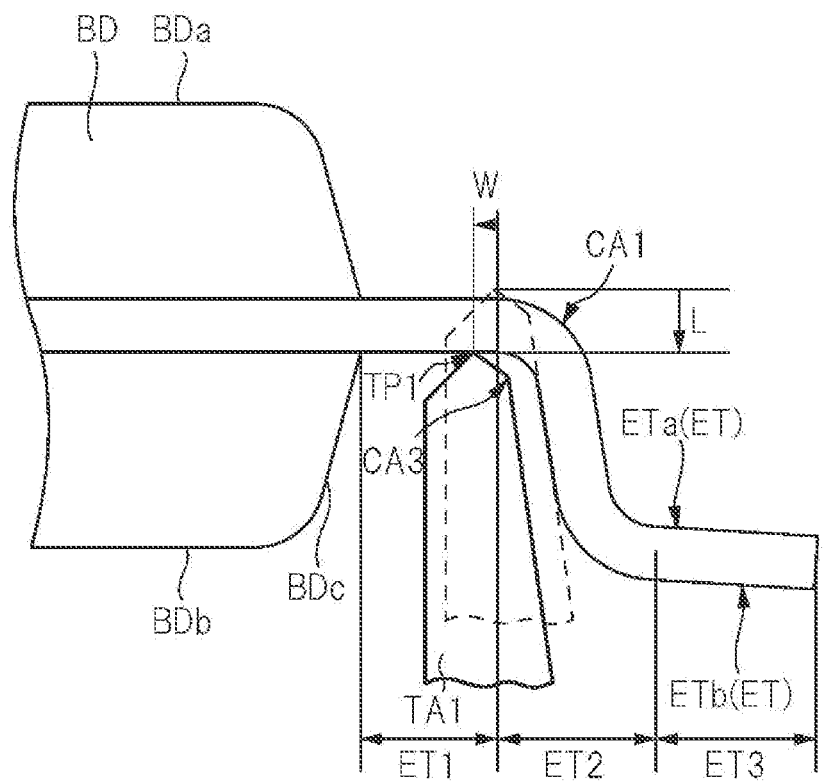
FIG. 11B is a cross-sectional view showing the electrical test step in the first embodiment following FIG. 11A.
Figure 12:
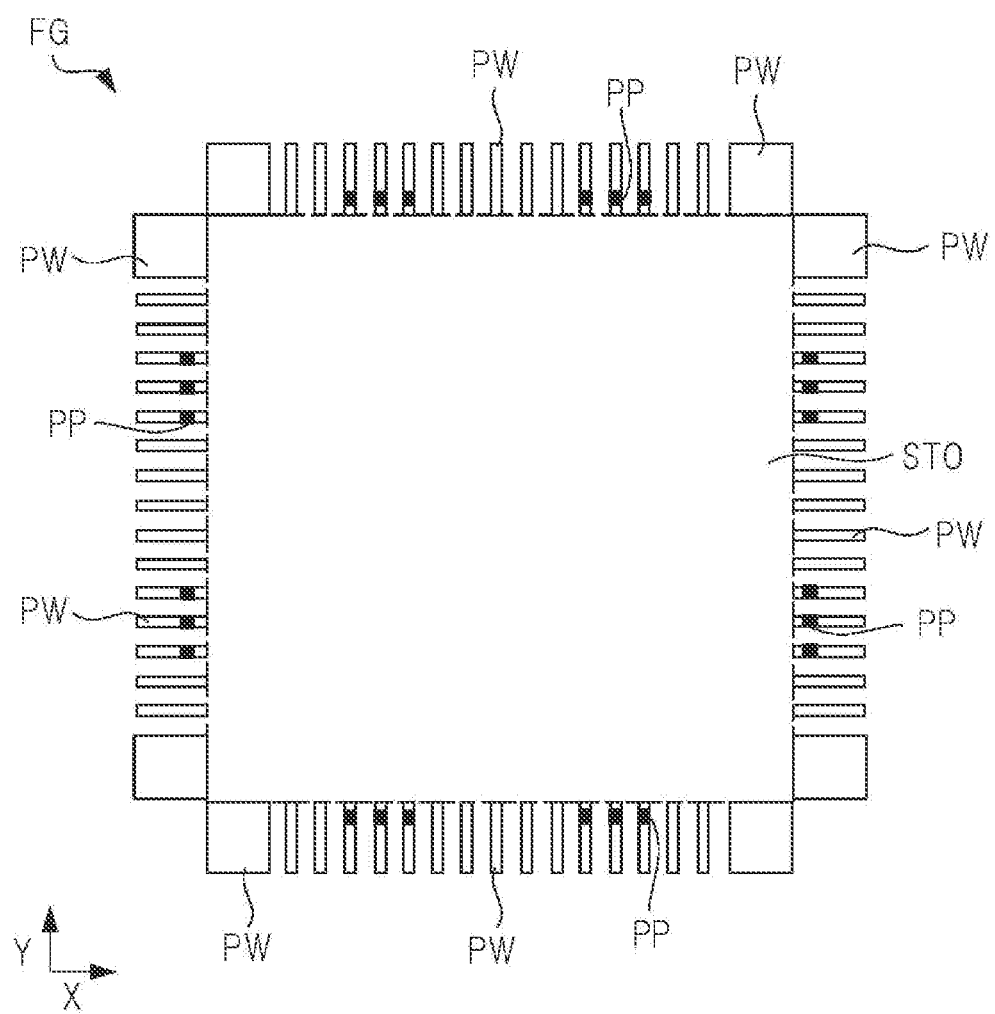
FIG. 12 is a main portion plan view of the test socket in a modified example of FIG. 8.
Figure 13A:
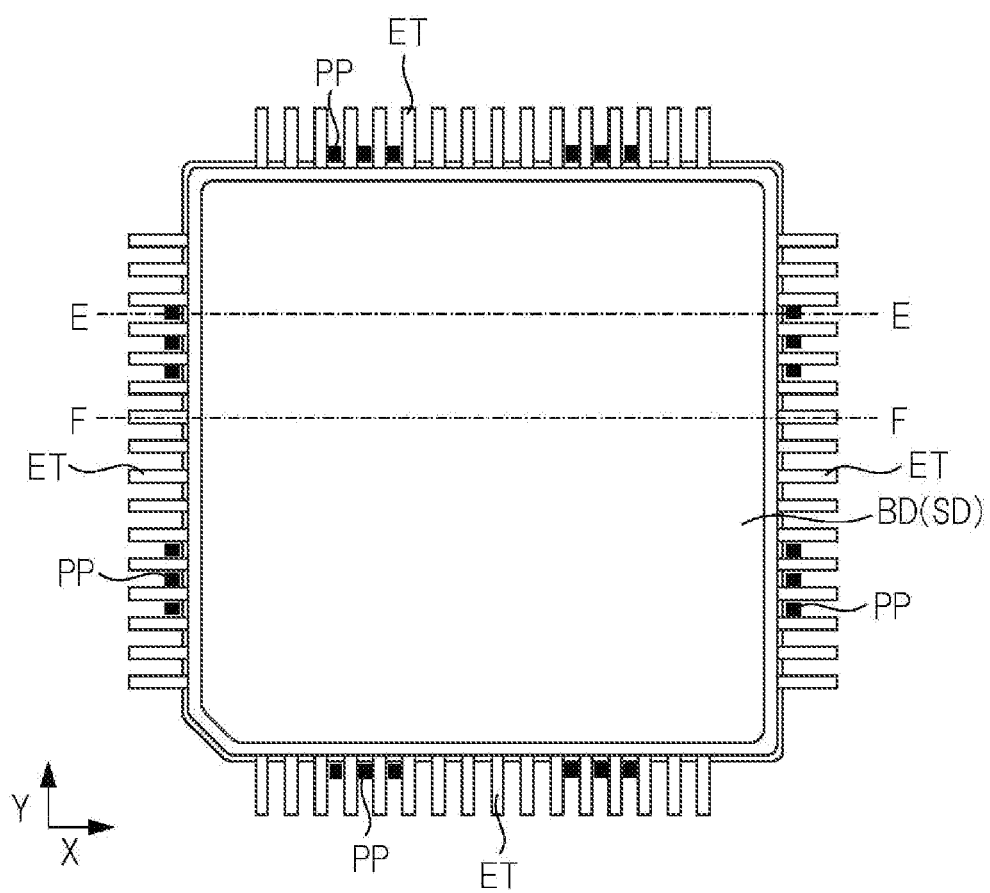
FIG. 13A is a main portion plan view of the test socket in the modified example of FIG. 9A.
Figure 13B:
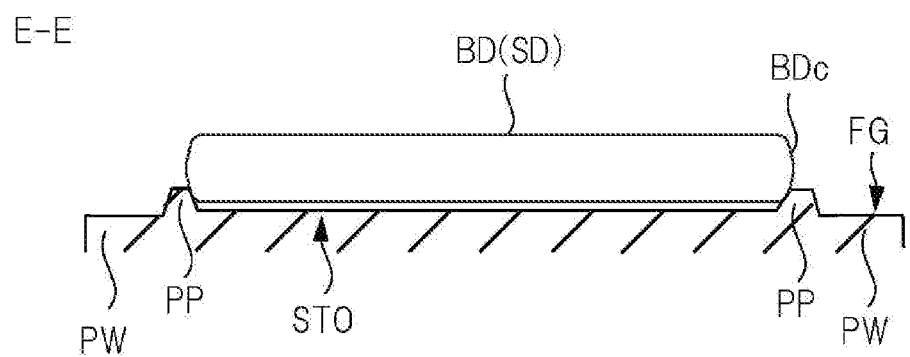
FIG. 13B is a cross-sectional view along E-E of the test socket shown in the FIG. 13A.
Figure 13C:
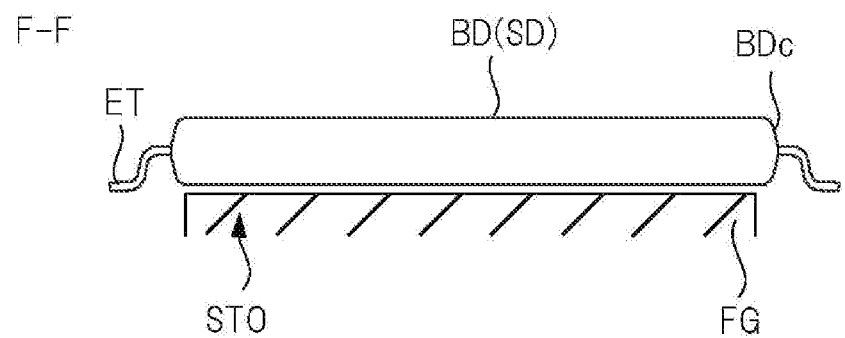
FIG. 13C is a cross-sectional view along F-F of the test socket shown in FIG. 13A.
Figure 14:
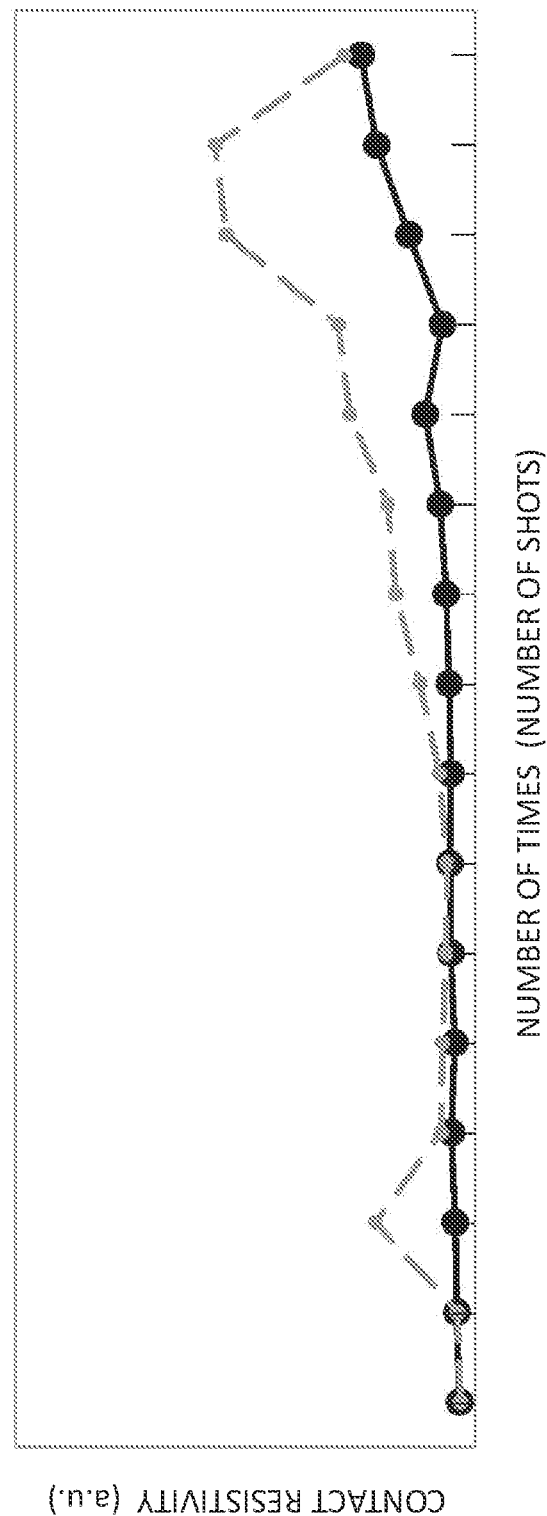
FIG. 14 is a diagram showing an effectiveness of the manufacturing method of the semiconductor device in the first embodiment.

FIG. 4 is a process flow diagram illustrating the manufacturing method of the semiconductor device in the first embodiment. FIG. 5 is a schematic diagram of a test device in the first embodiment. FIG. 6 is a perspective view of a test socket used for an electrical test in the first embodiment. FIG. 7 is a cross-sectional view showing an electrical test step of the semiconductor device in the first embodiment. FIG. 8 is a main portion plan view of the test socket in the first embodiment. FIG. 9A is a main portion plan view of the test socket in the first embodiment. FIG. 9B is a cross-sectional view along C-C of the test socket shown in the FIG. 9A. FIG. 9C is a cross-sectional view along D-D of the test socket shown in the FIG. 9A. FIG. 10 is an enlarged main portion view of a contact pin in the first embodiment. FIG. 11A is a cross-sectional view showing the electrical test step in the first embodiment. FIG. 11B is a cross-sectional view showing the electrical test step in the first embodiment following FIG. 11A. FIG. 12 is a main portion plan view of the test socket in a modified example of FIG. 8. FIG. 13A is a main portion plan view of the test socket in the modified example of FIG. 9A. FIG. 13B is a cross-sectional view along E-E of the test socket shown in the FIG. 13A. FIG. 13C is a cross-sectional view along F-F of the test socket shown in FIG. 13A. FIG. 14 is a diagram showing an effectiveness of the manufacturing method of the semiconductor device in the first embodiment.

As shown in FIG. 4, the manufacturing method of the semiconductor device SD of the first embodiment includes steps of STP1, STP2, and STP3. A test object is the semiconductor device SD prior to performing the electrical test, and is similar to a structure shown in FIGS. 1 to 3. The electrical test is performed on the test object to determine whether products are non-defective products or defective products.

The electrical test of the semiconductor device SD is performed using the test device shown in FIG. 5. The test device TS includes a test head TH that is electrically connected to a test socket SK for mounting the semiconductor device SD, a test substrate TB that is electrically connected to the semiconductor device SD via the test socket SK, and the test substrate TB. The test head TH is provided with a test circuit for inputting and outputting signal current to and from the semiconductor device SD, and the test circuit is electrically connected to the semiconductor device SD via the test substrate TB and the test socket SK. In the first embodiment, a control unit CU is disposed next to the test head TH, and the control unit CU is electrically connected to the test head TH. In the control unit CU, A control circuit for controlling the electrical test step is formed. However, a forming location of the control circuit is not limited to the embodiment shown in FIG. 5, and for example, the control circuit can be formed inside the test head TH as a modified example.

As shown in FIG. 6, the test socket SK has a base BS and a cover CV. Then, as shown in FIG. 5, the test socket SK is mounted on the test substrate TB and fixed by a fixing unit such as screw. The base BS is provided with a floating guide FG and a plurality of first contact pins TA1. The plurality of first contact pins TA1 is disposed around the floating guide FG. As shown in FIG. 7, the plurality of first contact pins TA1 is fixed to the base BS. As shown in FIG. 8, the floating guide FG includes a mounting portion STO, protective walls PW, and a positioning protrusion PP.

FIG. 7 is a cross-sectional view along B-B of FIG. 6 showing a state in which the semiconductor device SD is attached to the test socket SK, but the cover CV is omitted. The floating guide FG is separate from the base BS. The floating guide FG is movable up and down with respect to the base BS by providing a spring portion SP between the floating guide FG and the base BS. When the semiconductor device SD is attached to the test socket SK, and the cover CV is closed and clamped to the base BS, the floating guide FG on which the body BD is mounted descends, and the plurality of lead terminals ET are contacted with the plurality of first contact pin TAL. The first contact pin TA1 contacts the lead bottom surface ETb of the protruding portion ET1 as shown in FIG. 3. Then, the electrical test is performed on the semiconductor device SD in the state shown in FIG. 7.

The electrical test step (STP3) shown in FIG. 4 includes a first sub-step of placing the semiconductor device SD on the mounting portion STO, and a second sub-step of contacting the lead terminal ET with the first contact pin TAL by a pressing tool described later.

The first sub-step will be described with reference to FIG. 8, FIG. 9A, FIG. 9B and FIG. 9C.

As shown in FIG. 8, the rectangular mounting portion STO is disposed at a center of the floating guide FG, and a plurality of protective walls PW are disposed around the mounting portion STO. The mounting portion STO corresponds to a size of the body BD of the semiconductor device SD. The protective walls PW extends from each side of the rectangular mounting portion STO in a direction perpendicular to each side. The protective walls PW is disposed so as to sandwich the first contact pin TAL shown in FIG. 7. In other words, the protective walls PW is disposed such that the first contact pin TAL is sandwiched between adjacent protective walls PW. The protective walls PW prevent the first contact pin TAL from falling over. A positioning protrusion PP is provided on the protective walls PW located at the corner of the mounting portion STO.

FIG. 9A shows the relationship between the semiconductor device SD and the positioning protrusion PP. The mounting portion STO of the floating guide FG and the protective walls PW are omitted. The positioning protrusion PP is disposed on both sides of the body BD so as to sandwich the body BD in an X direction and a Y direction at corner portions of the semiconductor device SD. The positioning protrusion PP is disposed in an area that does not overlap with the lead terminal ET in plan view. In the FIG. 9B and FIG. 9C, the mounting portion STO, the protective walls PW, and the positioning protrusion PP of the floating guide FG are illustrated. When the semiconductor device SD is mounted on the mounting portion STO, the semiconductor device SD is positioned at a predetermined position by a plurality of the positioning protrusions PP disposed in the X direction and the Y direction. That is, as shown in the FIG. 9B, the semiconductor device SD is positioned by contacting the body side surface BDc with a side surface of the positioning protrusion PP. In this way, the lead terminal ET is disposed on the first contact pin TA1. In addition, in the illustrated FIG. 9C, the floating guide FG is narrower than the body BD, and both ends thereof are terminated in an area overlapping with the body BD.

It can be seen that by superimposing FIGS. 8 and 9A on the basis of the positioning protrusion PP, the protective walls PW and the positioning protrusion PP do not overlap the lead terminal ET in plan view (see FIG. 9B). In addition, the protective walls PW and the positioning protrusion PP do not overlap with each other because the protective walls PW is disposed so as to sandwich the first contact pin TAL in plan view (see FIG. 9C). As described above, since the positioning protrusion PP and the protective walls PW are disposed at positions that differ from the first contact pin TAL in plan view, the first contact pin TAL can be contacted with the lead bottom surface ETb of the protruding portion ET1 of the lead terminal ET (refer to FIGS. 3 and 7).

The second sub-step will be described with reference to FIG. 10, FIG. 11A, and FIG. 11B.

As illustrated in FIG. 10, the first contact pin TA1 includes a first top portion TP1 at a position where a first side S1 and a second side S2 intersect, and an arcuate portion CA3 is located at a position where the first side S1 and a third side S3 is intersected. The arcuate portion CA3 has an arcuate shape in a radius R3. The first top portion TP1 contacts the lead terminal ET.

FIG. 11A shows the first sub-step and FIG. 11B shows the second sub-step. As described with reference to the FIG. 9B, by positioning the semiconductor device SD at a predetermined position using the positioning protrusion PP, the lead terminal ET can be disposed on the first contact pin TAL. At this time, it is important that the first top portion TP1 of the first contact pin TAL is located closer to the connecting portion ET3 than a center ML of the protruding portion ET1 of the lead terminal ET. For example, the arcuate portion CA3 of the first contact pin TAL is disposed so as to overlap with the bending portion ET2. Here, the center ML is a point of half of a length of the protruding portion ET1 in an extending direction of the protruding portion ET1. In the first sub-step shown in FIG. 11A, the first top portion TP1 of the first contact pin TAL contacts the lead bottom surface ETb of the lead terminal ET. Specifically, the first top portion TP1 of the first contact pin TAL contacts the lead bottom surface ETb closer to the connecting portion ET3 than the center ML of the protruding portion ET1 of the lead terminal ET. At this time, the arcuate portion CA3 of the first contact pin TAL may be in contact with the bending portion ET2 of the lead terminal ET. The first top portion TP1 of the first contact pin TAL may also be contacted with the bending portion ET2.

In the second sub-step shown in FIG. 11B, a downward load is applied to the body upper surface BDa of the body BD or the connecting portion ET3 of the lead terminal ET by the pressing tool (not shown). At this time, since the connecting portion ET3 of the first contact pin TAL with the base BS is in the form of a leaf spring, a leaf spring-shaped portion of the first contact pin TAL is bent by applying the downward load. Due to the deflection, in the first sub-step, a contact position where the first top portion TP1 of the first contact pin TAL and the lead bottom surface ETb of the lead terminal ET come into contact with each other moves toward the body BD in the second sub-step. In other words, when the body upper surface BDa of the body BD or the connecting portion ET3 of the lead terminal ET is depressed by a distance L, a top of the first contact pin TA1 moves by a distance W toward the body BD along the lead bottom surface ETb. This operation is called "wiping". When the downward load is increased in order to reduce a contact resistance between the lead terminal ET and the first contact pin TAL, the wiping distance (distance W) also increases, and the first top portion TP1 of the first contact pin TAL is close to the body side surface BDc of the body BD. Resin burrs may remain on the lead bottom surface ETb in a vicinity of the body BD, and when the first top portion TP1 reaches the resin burrs, the contact resistance increases. Therefore, in order to prevent increasing the contact resistance due to wiping, in the first sub-step, the first top portion TP1 of the first contact pin TAL is positioned closer to the connecting portion ET3 than the center ML of the protruding portion ET1 of the lead terminal ET. The distance W can be adjusted by adjusting the distance L for pushing down the body upper surface BDa or the connecting portion ET3 of the body BD. As a result, it is possible to ensure good contact between the first top portion TP1 of the first contact pin TAL and the lead terminal ET (the protruding portion ET1), and the contact resistance between the first contact pin TAL and the lead terminal ET can be reduced.

Further, the radius R3 of the arcuate portion CA3 of the first contact pin TAL is equal to or less than the first radius R1 of the first arcuate portion CA1 (see FIG. 3) located on the bending portion ET2 of the lead terminal ET (R3≤R1). With this relationship, in the first sub-step or the second sub-step, the arcuate portion CA3 is movable along the first arcuate portion CA1. When the radius R3 of the arcuate portion CA3 is larger than the first radius R1 of the arcuate portion CA1, the arcuate portion CA3 may stick into the arcuate portion CAL and may not move along the arcuate portion CA1.

Next, a modified example of the test socket SK will be described with reference to FIG. 12, FIG. 13A, FIG. 13B, and FIG. 13C. The modified example relates to an arrangement of the positioning protrusion PP. Elements other than the positioning protrusion PP are the same as those in FIG. 8, FIG. 9A, FIG. 9B, and FIG. 9C.

In the modified example, as shown in FIG. 12, the positioning protrusion PP is disposed on the respective sides of the square mounting portion STO. It can be seen that by superimposing FIGS. 12 and 13A on the basis of the positioning protrusion PP, the protective walls PW and the positioning protrusion PP do not overlap the lead terminal ET in plan view (see FIG. 13B). In addition, the protective walls PW and the positioning protrusion PP do not overlap with each other because the protective walls PW is disposed so as to sandwich the first contact pin TAL in plan view (see FIG. 13C). As described above, since the positioning protrusion PP and the protective walls PW are disposed at positions that differ from the first contact pin TA1 in plan view, the first contact pin TA1 can be contacted with the lead bottom surface ETb of the protruding portion ET1 of the lead terminal ET (refer to FIGS. 3 and 7). Note that, the arrangement of the positioning protrusion PP shown in FIGS. 8 and 12 may be mixed.

FIG. 14 shows a contact resistivity between the first contact pin TAL and the lead terminal ET when the electrical test step (STP3) is performed on the plurality of the semiconductor device SD. A vertical axis shows the contact resistivity between the first contact pin TAL and the lead terminal ET. A horizontal axis shows a number of times that the lead terminal ET is contacted with the same first contact pin TA1. And the measurement results on the right side of this graph indicate that the number of times of contact with the same contact pin is large. A solid line indicates the contact resistance in the first embodiment. That is, the first contact pin TAL contacts the protruding portion ET1 of the lead terminal ET. A dashed line indicates the contact resistance in a conventional technique. That is, the first contact pin TAL is in contact with the connecting portion ET3 of the lead terminal ET, which is the same structure as in the Patent Document 1. The first embodiment can achieve lower resistivity than the conventional technique even if the number of shots is increased. Therefore, in the first embodiment, an accuracy of the electrical test can be improved as compared with the conventional technique. Here, the number of shots is the number of times the first contact pin TAL is contacted with the lead terminal ET.

In the step of preparing the test object (STP1), the semiconductor device SD is stored in a storage jig. At this time, in the storage jig, the lead bottom surface ETb of the connecting portion ET3 of the semiconductor device SD contacts a storage portion of the storage jig. When performing the electrical test, the semiconductor device SD is removed from the storage jig. Then, another semiconductor device SD is stored in the same storage jig to prepare for an electrical test of another semiconductor device SD. By repeating this operation, a fragment (such as a resin piece or a plated piece) that is detached from semiconductor devices SD is deposited on the storage portion of the storage jig, and the fragment is likely to adhere to the connecting portion ET3. Further, in the related art, when the electrical test is repeated, the fragment adhering to the connecting portion ET3 is often reattached to the first contact pin TA1, and the contact resistivity between the first contact pin TAL and the lead terminal ET is increased. On the other hand, in the storage jig, the lead bottom surface ETb of the protruding portion ET1 of the semiconductor device SD does not touch the storage portion of the storage jig. In case of the first embodiment, the contact between the first contact pin TAL and the lead terminal ET is made by the lead bottom surface ETb of the protruding portion ET1 of the semiconductor device SD. And it is unlikely that the fragment will adhere to the protruding portion ET1 of the semiconductor device SD. Then, the fragment will not adhere to the first contact pin TA1. Therefore, the first embodiment has a lower contact resistance than the conventional technique.

Features of the First Embodiment

The manufacturing method of the semiconductor device and the test socket for using in the manufacturing method have the following features:

The reliability of connecting the lead terminal ET to the mounting substrate can be improved because the first contact pin TA1 is contacted with the lead bottom surface ETb of the protruding portion ET1 of the lead terminal ET to perform the electrical test. In other words, in the electrical test step, the first contact pin TAL is not contacted with the connecting portion ET3 of the lead terminal ET, so that the unevennesses do not occur on a surface of the plated layer provided on the connecting portion ET3. Therefore, the reliability of connecting between the lead terminal ET and the mounting substrate can be improved.

Since the electrical test is performed by the first contact pin TAL is contacted with the lead bottom surface ETb of the protruding portion ET1 of the lead terminal ET, the accuracy of the electrical test can be improved. This is because the contact resistivity between the first contact pin TAL and the lead terminal ET is kept low even if the number of shots is increased.

In order to prevent the contact resistance from being increased due to the wiping, in the first sub-step, the first top portion TP1 of the first contact pin TAL is positioned closer to the connecting portion ET3 than the center ML of the protruding portion ET1 of the lead terminal ET. Since the downward load applied to the lead terminal ET is not affected by the resin burrs, the contact resistivity between the first contact pin TAL and the lead terminal ET can be reduced to improve the accuracy of the electrical test.

The radius R3 of the arcuate portion CA3 of the first contact pin TAL is equal to or less than the first radius R1 of the first arcuate portion CA1 of the lead terminal ET. In the first sub-step or the second sub-step, the arcuate portion CA3 can be moved along the first arcuate portion CA1, and good contact between the first top portion TP1 of the first contact pin TAL and the lead terminal ET (the protruding portion ET1) can be ensured.

In plan view, since the positioning protrusion PP is disposed without overlapping with the first contact pin TA1, the first contact pin TAL can be contacted with the protruding portion ET1 of the lead terminal ET without being affected by the positioning protrusion PP. The positioning protrusion PP is disposed on the protective walls PW which is disposed so as to sandwich the first contact pin TAL in plan view. The positioning protrusion PP is included in the protective walls PW in plan view.

Second Embodiment

A second embodiment relates to a Kelvin test (Kelvin contact method), and is obtained by adding a second contact pin TA2 to the first embodiment. And the same explanation as the first embodiment is omitted.

Figure 15:
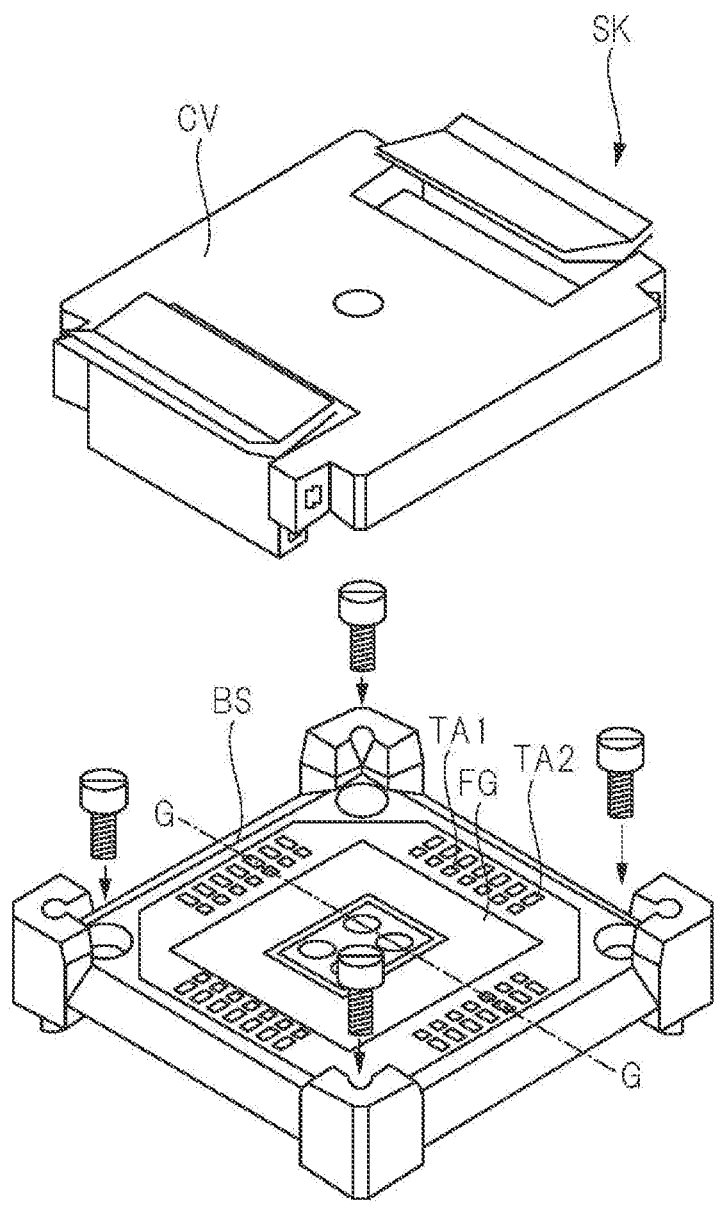
FIG. 15 is a perspective view of a test socket used for an electrical test in a second embodiment.
Figure 16:
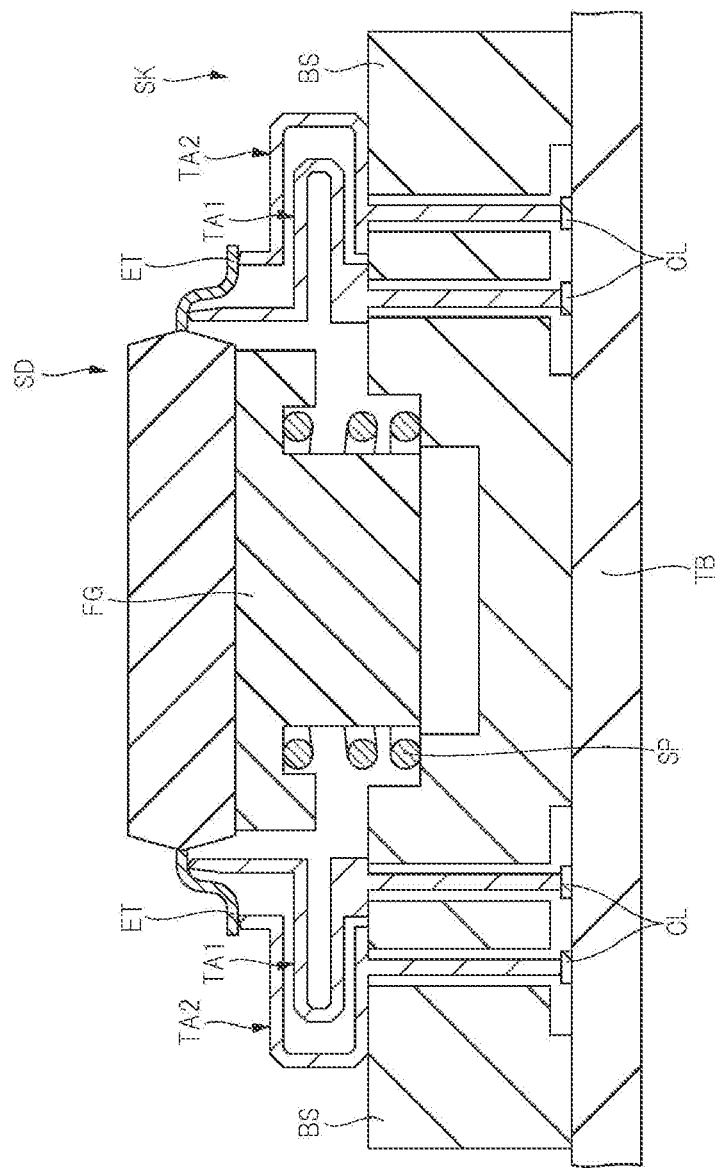
FIG. 16 is a cross-sectional view showing an electrical test step of a semiconductor device in the second embodiment.
Figure 17:
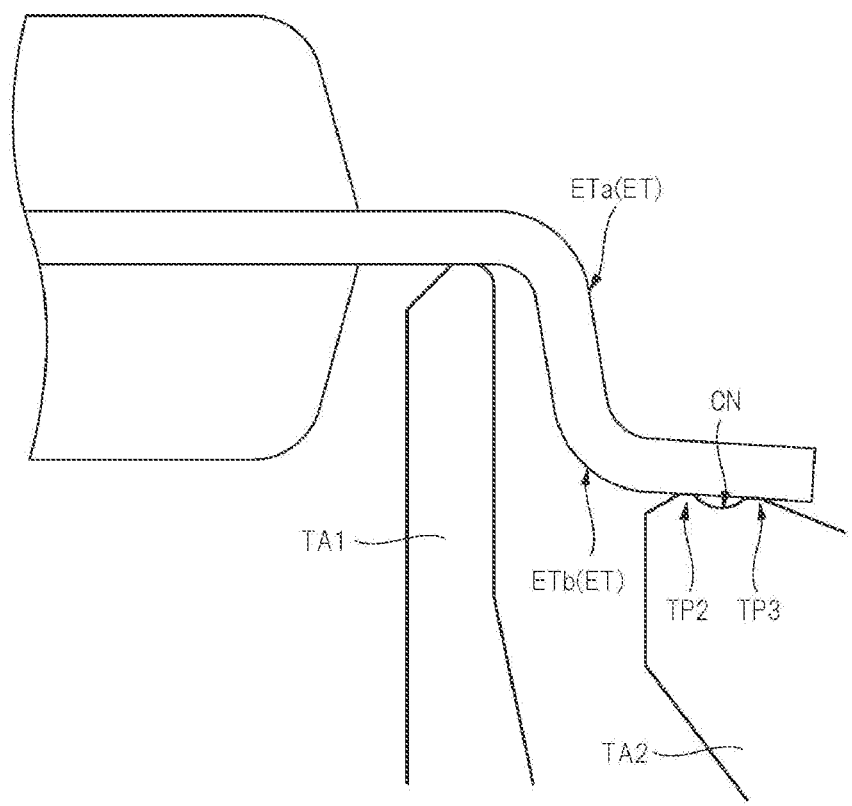
FIG. 17 is a cross-sectional view showing the electrical test step in the second embodiment.
Figure 18:
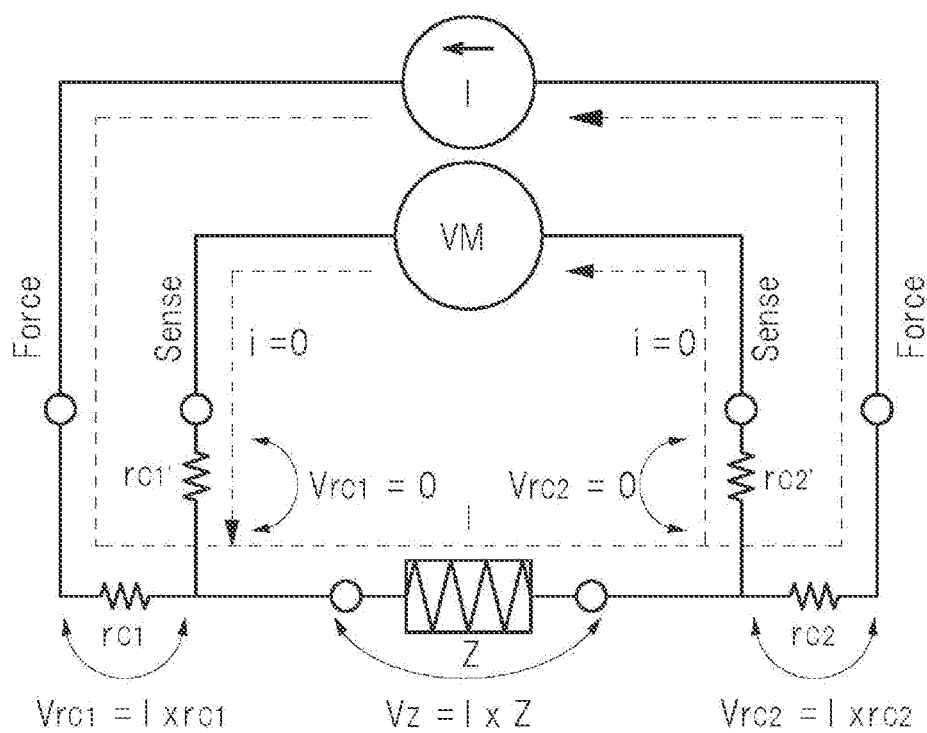
FIG. 18 is an equivalent circuit diagram of the electrical test step in the second embodiment.

FIG. 15 is a perspective view of a test socket used for an electrical test in the second embodiment. FIG. 16 is a cross-sectional view showing an electrical test step of a semiconductor device in the second embodiment. FIG. 17 is a cross-sectional view showing the electrical test step in the second embodiment. FIG. 18 is an equivalent circuit diagram of an electrical test step in the second embodiment.

As shown in FIG. 15, a first contact pin TAL and the second contact pin TA2 are disposed in annular around the floating guide FG of the test socket SK. The first contact pin TAL is located relatively inside and the second contact pin TA2 is located relatively outside.

As shown in FIG. 16, the first contact pin TAL and second contact pin TA2 are contacted with a same lead terminal ET. The first contact pin TAL contacts a lead bottom surface ETb of the protruding portion ET1 (refer to FIG. 3), and the second contact pin TA2 contacts the lead bottom surface ETb of a connecting portion ET3 (see FIG. 3). As compared with the Patent Document 2 in which the first contact pin TAL and the second contact pin TA2 are contacted with the connecting portion ET3, the unevennesses of a plated layer on the connecting portion ET3 can be reduced, so that the wettability of a solder material is improved and the reliability of the connection between the lead terminal and a mounting substrate is improved.

The first contact pin TAL and the second contact pin TA2 contacted with the same lead terminal ET are sandwiched between a pair of protective walls PW in plan view as shown in FIGS. 8 and 9A. In other words, the protective walls PW is disposed such that the first contact pin TAL and the second contact pin TA2 are sandwiched between adjacent the protective walls PW.

As shown in FIG. 17, the second contact pin TA2 includes a second top portion TP2 and a third top portion TP3 so as to sandwich a concave portion CN, and the second top portion TP2 and the third top portion TP3 are in contact with the connecting portion ET3. With this configuration, the contact resistivity between the second contact pin TA2 and the lead terminal ET can be reduced. However, the second contact pin TA2 is not limited to a configuration including two top portions, and may include one top portion or two or more top portions as in the case of the first contact pin TA1.

As shown in FIG. 18, in the Kelvin contact method, a force line (Force) for supplying a current (I) to a circuit under test and a sense line (Sense) for measuring a voltage drop (Vz) of a circuit under test are separated from each other. Then, two contact pins of the first contact pin TAL and the second contact pin TA2 are contacted with terminals on both sides of a circuit-under-test to measure a voltage drop (VM). Preferably, the first contact pin TAL is connected to the sense line and the second contact pin TA2 is connected to the force line. In this measurement method, no current flows through the sense line connected to a voltmeter (i=0), so that the voltage drop caused by the contact resistance and a line resistance is cancelled out. As a consequence, it is possible to measure only the voltage drop (Vz) due to an impedance (Z) of the circuit under test (VM=Vz).

Although the present invention has been described in detail based on embodiments, the present invention is not limited to the above described embodiments, and various modifications can be made without departing from the gist of the present invention.

What is claimed is:

1. A manufacturing method of a semiconductor device comprising steps of:
    (a) preparing a test object, the test object including a body sealing a semiconductor chip and a lead terminal electrically connected to the semiconductor chip and having a lead upper surface and a lead bottom surface opposite to the lead upper surface;
    (b) preparing a test socket, the test socket including a mounting portion for placing the test object, and a first contact pin disposed around the mounting portion; and
    (c) performing an electrical test of the semiconductor chip so as to contact the lead terminal with the first contact pin, wherein
    the lead terminal has a protruding portion protruded from the body, a connecting portion connected to a mounting substrate and a bending portion connected between the protruding portion and the connecting portion, and
    in the step of (c), the first contact pin contacts with the lead bottom surface of the protruding portion,
    a first top portion of the first contact pin contacts with the lead terminal, in the step of (c), including:
        (c1) placing the test object on the mounting portion and disposing the lead terminal on the first top portion of the first contact pin; and
        (c2) pushing down the lead terminal in a direction of the first contact pin by a pressing tool,
    in the step of (c1), the first top portion is disposed so as to locate closer to the connecting portion of the lead terminal than a center of the protruding portion of the lead terminal,
    the bending portion has a first arcuate portion at a boundary with the protruding portion, the first contact pin has a first side, a second side and a third side,
    the first top portion is located at an intersection of the first side and the second side,
    a second arcuate portion is located at an intersection of the first side and the third side, and
    the first arcuate portion has a first radius and the second arcuate portion has a second radius less than or equal to the first radius.

2. The manufacturing method of the semiconductor device according to claim 1, wherein
    the body has a body upper surface, a body bottom surface, and a body side surface connecting the body upper surface and the body bottom surface,
    the protruding portion is relatively located on the body upper surface side in a thickness direction of the body,
    the connecting portion is relatively located on the body bottom surface side in the thickness direction of the body, and
    the bending portion is extended in a direction intersecting the body upper surface.

3. The manufacturing method of the semiconductor device according to claim 2, wherein
    the test socket includes a second contact pin, and
    in the step of (c), the second contact pin contacts with the lead bottom surface of the connecting portion.

4. The manufacturing method of the semiconductor device according to claim 3, wherein the second contact pin has a second top portion and a third top portion to be contacted with the connecting portion of the lead terminal.

5. The manufacturing method of the semiconductor device according to claim 3, wherein
    the electrical test in the step of (c), a Kelvin contact method is used in which a sense line for measuring a voltage of the test object and a force line for supplying a current to the test object are separated,
    the first contact pin is connected to the sense line, and
    the second contact pin is connected to the force line.

6. The manufacturing method of the semiconductor device according to claim 1, wherein the lead bottom surface of the lead terminal is covered with a plated layer.

7. The manufacturing method of the semiconductor device according to claim 1, wherein the lead terminal is formed in a gall-wing shape.

8. The manufacturing method of the semiconductor device according to claim 1, wherein:
    a positioning protrusion is disposed around the mounting portion in plan view, and
    in the step of (c1), in plan view, the lead terminal is disposed so as to overlap the first contact pin by contacting the body side surface to a side surface of the positioning protrusion.

9. The manufacturing method of the semiconductor device according to claim 8, wherein a pair of protective walls is disposed around the mounting portion so as to sandwich the first contact pin in plan view.

10. The manufacturing method of the semiconductor device according to claim 9, wherein the positioning protrusion is disposed on at least one of the protective walls of the pair of protective walls without overlapping the first contact pin in plan view.

11. A test socket comprising:
a base attached with a first contact pin, and
a floating guide separates from the base and includes a mounting portion for placing a test object including a body and a lead terminal, wherein
the body seals a semiconductor chip and has a body upper surface, a body bottom surface, and a body side surface connecting the body upper surface and the body bottom surface,
the lead terminal electrically connects to the semiconductor chip and has a lead upper surface and a lead bottom surface opposite to the lead upper surface,
the lead terminal has a protruding portion protruded from the body, a connecting portion connected to a mounting substrate and a bending portion connected between the protruding portion and the connecting portion,
an electrical test is performed by contacting the first contact pin to the lead bottom surface of the protruding portion,
the floating guide includes a positioning protrusion disposed around the mounting portion in plan view,
in plan view, the lead terminal is disposed so as to overlap the first contact pin by contacting the body side surface to a side surface of the positioning protrusion,
the floating guide includes a pair of protective walls is disposed around the mounting portion so as to sandwich the first contact pin in plan view,
the bending portion has a first arcuate portion at a boundary with the protruding portion, the first contact pin has a first side, a second side and a third side,
a first top portion is located at an intersection of the first side and the second side,
a second arcuate portion is located at an intersection of the first side and the third side, and
the first arcuate portion has a first radius and the second arcuate portion has a second radius less than or equal to the first radius.

12. The test socket according to claim 11, wherein the lead bottom surface of the lead terminal is covered with a plated layer.

13. The test socket according to claim 11, wherein the positioning protrusion is disposed on at least one of the protective walls of the pair of protective walls without overlapping the first contact pin in plan view.

14. The test socket according to claim 11, wherein the base includes a second contact pin, and the electrical test is performed by contacting the second contact pin to the lead bottom surface of the connecting portion.

15. The test socket according to claim 14, wherein the second contact pin is sandwiched between the pair of protective walls in plan view.

* * * * *